US012756292B2

(12) United States Patent
Khayat

(10) Patent No.: US 12,756,292 B2
(45) Date of Patent: Oct. 6, 2026

(54) PULSED TRANSISTOR DRIVER CIRCUIT

(71) Applicant: TEXAS INSTRUMENTS INCORPORATED, Dallas, TX (US)

(72) Inventor: Joseph M Khayat, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 522 days.

(21) Appl. No.: 18/192,000

(22) Filed: Mar. 29, 2023

(65) Prior Publication Data

US 2024/0258904 A1 Aug. 1, 2024

Related U.S. Application Data

(60) Provisional application No. 63/441,675, filed on Jan. 27, 2023.

(51) Int. Cl.

| | |
|---|---|
| ***H02M 1/088*** | (2006.01) |
| ***H02M 1/00*** | (2006.01) |
| ***H02M 3/158*** | (2006.01) |
| ***H03K 17/0812*** | (2006.01) |

(52) U.S. Cl.

CPC ......... *H02M 1/088* (2013.01); *H02M 1/0054* (2021.05); *H02M 3/158* (2013.01); *H03K 17/08122* (2013.01)

(58) Field of Classification Search

CPC ...... H02M 1/088; H02M 1/0054; H02M 1/08; H02M 3/158; H03K 17/08122

See application file for complete search history.

(56) References Cited

U.S. PATENT DOCUMENTS

| | | | | |
|---|---|---|---|---|
| 6,208,185 | B1 * | 3/2001 | John | H03K 17/168 327/434 |
| 7,479,770 | B2 * | 1/2009 | Kohout | H03K 17/166 327/381 |
| 2010/0283515 | A1 * | 11/2010 | Kelley | H03K 17/04123 327/109 |

FOREIGN PATENT DOCUMENTS

| | | | | |
|---|---|---|---|---|
| CN | 102208864 A | * | 10/2011 | H02M 1/08 |
| CN | 106357099 A | * | 1/2017 | H02M 1/08 |
| CN | 106849621 A | * | 6/2017 | H02M 1/088 |

* cited by examiner

*Primary Examiner* — Monica Lewis
*Assistant Examiner* — Jye-June Lee
(74) *Attorney, Agent, or Firm* — Zhenhai Fu; Frank D. Cimino

(57) ABSTRACT

A circuit includes a first drive stage, a second drive stage, and a pulse circuit. The first drive stage is coupled between a drive terminal and high-side transistor control terminal. The second drive stage is coupled between the first drive stage and the high-side transistor control terminal. The pulse circuit is coupled between the high-side transistor control terminal and the second drive stage. The pulse circuit is configured to disable the second drive stage for a pulse interval responsive to a voltage at the high-side transistor control terminal exceeding a threshold voltage.

16 Claims, 6 Drawing Sheets

PULSED TRANSISTOR DRIVER CIRCUIT

CROSS-REFERENCE TO RELATED APPLICATIONS

This application claims priority to U.S. Provisional Application No. 63/441,675, filed Jan. 27, 2023, entitled "Ringing Reduction Pulsed Stage FET Driver", which is hereby incorporated by reference.

BACKGROUND

Power transistors can be switched on and off rapidly to reduce switching losses. Because the control terminal of the power transistor may present significant capacitance, a driver circuit may be employed to buffer an input signal and drive the control terminal of the power transistor. The driver circuit receives a low-power input signal and buffers the input signal to produce a high-current signal that quickly charges or discharges the input capacitance of the power transistor. Examples of power transistors with which a driver circuit may be employed include insulated gate bipolar transistors and metal oxide semiconductor field-effect-transistors.

SUMMARY

In one example, a circuit includes a first drive stage, a second drive stage, and a pulse circuit. The first drive stage has a first drive input, a first drive output, and a second drive output. The first drive input is coupled to a drive terminal. The second drive stage has a second drive input, a third drive input, and a third drive output. The second drive input is coupled to the first drive output. The third drive output is coupled to the second drive output. The pulse circuit has a pulse input and a pulse output. The pulse input is coupled to the second drive output. The pulse output is coupled to the third drive input.

In another example, a circuit includes a first drive stage, a second drive stage, and a pulse circuit. The first drive stage is coupled between a drive terminal and high-side transistor control terminal. The second drive stage is coupled between the first drive stage and the high-side transistor control terminal. The pulse circuit is coupled between the high-side transistor control terminal and the second drive stage. The pulse circuit is configured to disable the second drive stage for a pulse interval responsive to a voltage at the high-side transistor control terminal exceeding a threshold voltage.

In a further example, a circuit includes a low-side transistor, a high-side transistor, a low-side drive circuit, and a high-side drive circuit. The low-side transistor is coupled between a switching terminal and a ground terminal. The low-side transistor has a first control input. The high-side transistor is coupled between a power terminal and the switching terminal. The high-side transistor has a second control input. The low-side drive circuit has a first drive output coupled to the first control input. The high-side drive circuit has a second drive output coupled to the second control input. The high-side drive circuit includes a first drive stage, a second drive stage, and a pulse circuit. The first drive stage is coupled between a drive terminal and high-side transistor control terminal. The second drive stage is coupled between the first drive stage and the high-side transistor control terminal. The pulse circuit is coupled between the high-side transistor control terminal and the second drive stage. The pulse circuit is configured to disable the second drive stage for a pulse interval responsive to a voltage at the high-side transistor control terminal exceeding a threshold voltage.

DETAILED DESCRIPTION

In DC-DC converters, fast switching may be desirable to improve converter efficiency. However, fast switching may also produce overshoot that increases the voltage across the switching transistors, and may damage the transistors. For example, in a step-down (buck) converter, when the high-side switching transistor is turned on, the voltage at the source of the high-side switching transistor may increase rapidly and produce overshoot and ringing that can stress the low-side switching transistor. To protect the low-side switching transistor, a clamp circuit may be provided to limit the voltage across the low-side switching transistor. Activation of the clamp circuit to protect the low-side switching transistor can also reduce converter efficiency.

The transistor drive circuit described herein manages high-side transistor turn on to balance switching loss in the high-side transistor, clamp power loss, and the voltage across the low-side transistor. The transistor drive circuit includes multiple drive stages, and control circuitry that anticipates the rate of voltage increase across the low-side switching transistor, and momentarily reduces the drive provided to the high-side switching transistor to reduce the rate of voltage increase. The control circuitry includes a sense transistor that monitors the control voltage (e.g., VGs) applied to the high-side transistor. When the control voltage applied to the high-side transistor equals or exceeds a threshold (e.g., the Miller plateau), the control circuitry momentarily disables a selected pull-up stage of the transistor driver to decrease the turn-on rate of the high-side transistor and reduce the rate of voltage increase across the low-side transistor. When the drain-to-source voltage across the high-side transistor is nearing zero (or very small), the control circuitry may reactivate the selected pull-up stage of the transistor driver, allowing the transistor driver to then rapidly charge the gate to source voltage to full enhancement of the high-side transistor.

Figure 1:
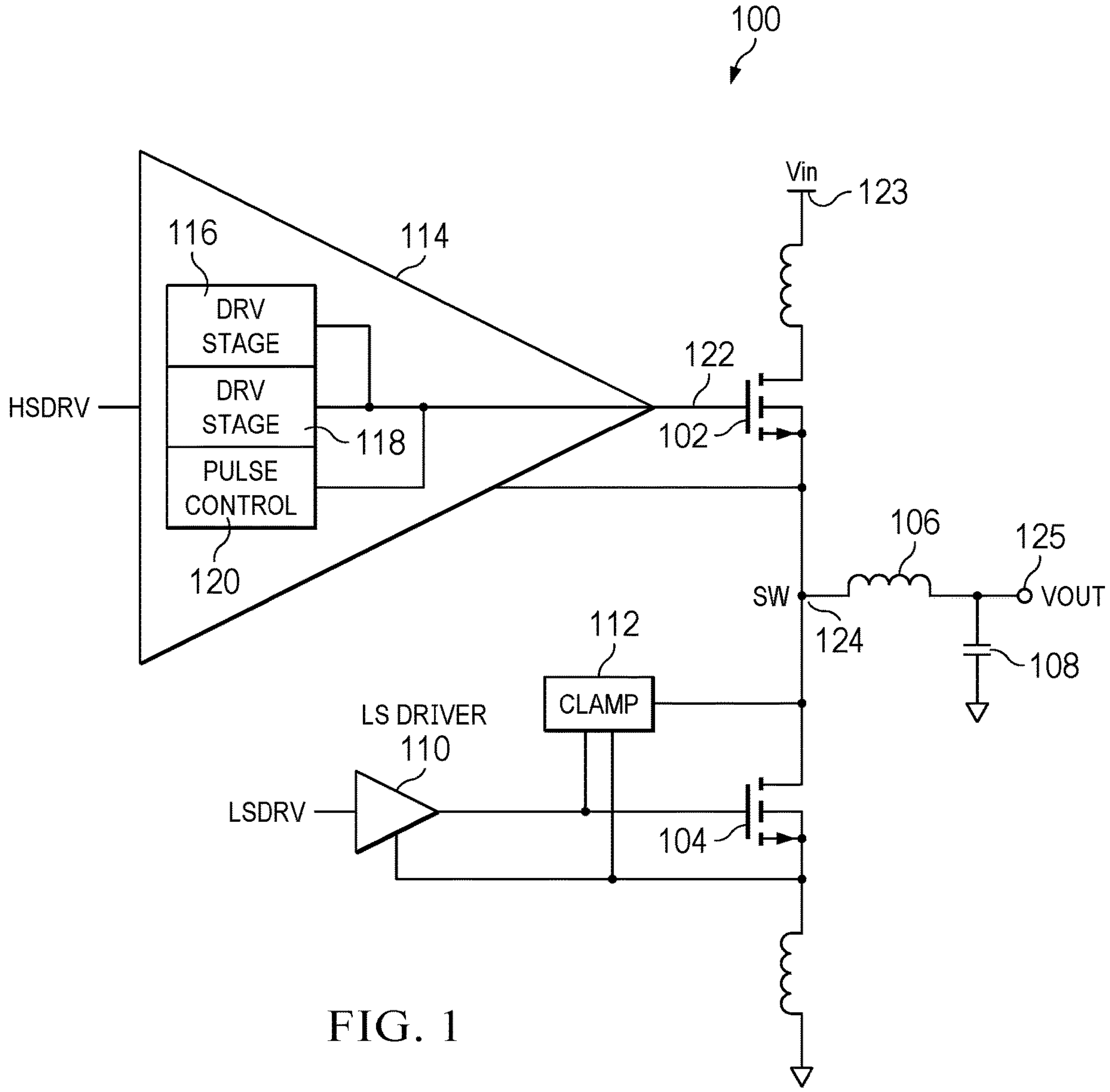
FIG. 1 is an example of a schematic diagram of a half-bridge circuit configured as a power stage of step-down switching converter.

FIG. 1 is a schematic diagram of a half-bridge circuit 100 configured as a power stage of a step-down switching converter. The half-bridge circuit 100 includes a high-side transistor 102, a low-side transistor 104, an inductor 106, an output capacitor 108, a low-side transistor driver circuit 110, a clamp circuit 112, and a high-side transistor driver circuit 114. The high-side transistor 102 and the low-side transistor 104 may be n-channel field effect transistors (NFETs). The high-side transistor 102 is coupled between a power terminal 123 and a switching node 124. The low-side transistor 104 is coupled between the switching node 124 and a ground terminal. Conductors between the power terminal 123 and the high-side transistor 102 and between the low-side transistor 104 and the ground terminal produce parasitic inductances that cause voltage disturbances across the high-side transistor 102 and the low-side transistor 104 during commutation of the current in the transistors 102 and 104.

The inductor 106 is coupled between the switching node 124 and an output terminal 125. The output capacitor 108 is coupled between the output terminal 125 and the ground terminal. When the high-side transistor 102 is on and the low-side transistor 104 is off, current flows from the power terminal 123 through the high-side transistor 102 to charge the inductor 106 (energy is stored in the magnetic field of the inductor 106), and the output capacitor 108, in the Buck configuration. When the high-side transistor 102 is off and the low-side transistor 104 is on, the current commutates from the ground terminal to the output capacitor 108, thus reducing the current through the inductor 106.

The low-side transistor driver circuit 110 controls switching of the low-side transistor 104. An output of the low-side transistor driver circuit 110 is coupled to a control input (e.g., gate) of the low-side transistor 104. An input of the low-side transistor driver circuit 110 is coupled to a controller (e.g., a pulse width modulator) that provides a low-side control signal LSDRV to control the low-side transistor 104. The clamp circuit 112 is coupled between the switching node 124 and the control input of the low-side transistor 104. The clamp circuit 112 monitors the voltage at the switching node 124 (the voltage across the low-side transistor 104) and can turn on the low-side transistor 104 if the voltage at the switching node 124 exceeds a threshold. Accordingly, the clamp circuit 112 may reduce the voltage across the low-side transistor 104 by enabling the low-side transistor 104 to conduct current, which reduces the efficiency of the half-bridge circuit 100.

The high-side transistor driver circuit 114 provides a drive signal 122 to control switching of the high-side transistor 102. An output of the high-side transistor driver circuit 114 is coupled to a control input (e.g., gate) of the high-side transistor 102. An input of the high-side transistor driver circuit 114 is coupled to a controller (e.g., a pulse width modulator) or a drive terminal that provides a high-side control signal HSDRV to control the high-side transistor 102. The high-side transistor driver circuit 114 includes a drive stage 116, a drive stage 118, and a pulse circuit 120. The drive stage 116 and the drive stage 118 generate the drive signal 122. The drive signal 122 charges the control input of the high-side transistor 102. More specifically, the drive stage 116 and the drive stage 118 source current to charge the capacitance of the control input of the high-side transistor 102. The pulse circuit 120 is coupled to the drive stage 118. The pulse circuit 120 can enable or disable the drive stage 118 to control the current of the drive signal 122. The pulse circuit 120 monitors the voltage of the drive signal 122 (the voltage at the control input of the high-side transistor 102). When the high-side transistor driver circuit 114 is turning on the high-side transistor 102, and the voltage of the drive signal 122 increases to at least a predetermined threshold, the pulse circuit 120 disables the drive stage 118 momentarily to decrease the current of the drive signal 122 and slow down the turn-on of the high-side transistor 102. The pulse circuit 120 generates a pulse that briefly disables the drive stage 118. Slowing the turn on of the high-side transistor 102 reduces the transient parasitic currents at the switch node 124 capacitance, and the parasitic voltage developed across the parasitic inductance on the power terminal 123. The overshoot at the switching node 124 is reduced (reducing the voltage across the low-side transistor 104 resulting from the turn on of the high-side transistor 102). Reducing overshoot at the switching node 124 protects the low-side transistor 104, and reduces the time that the clamp circuit 112 is active, which increases the efficiency of the half-bridge circuit 100.

Figure 2:
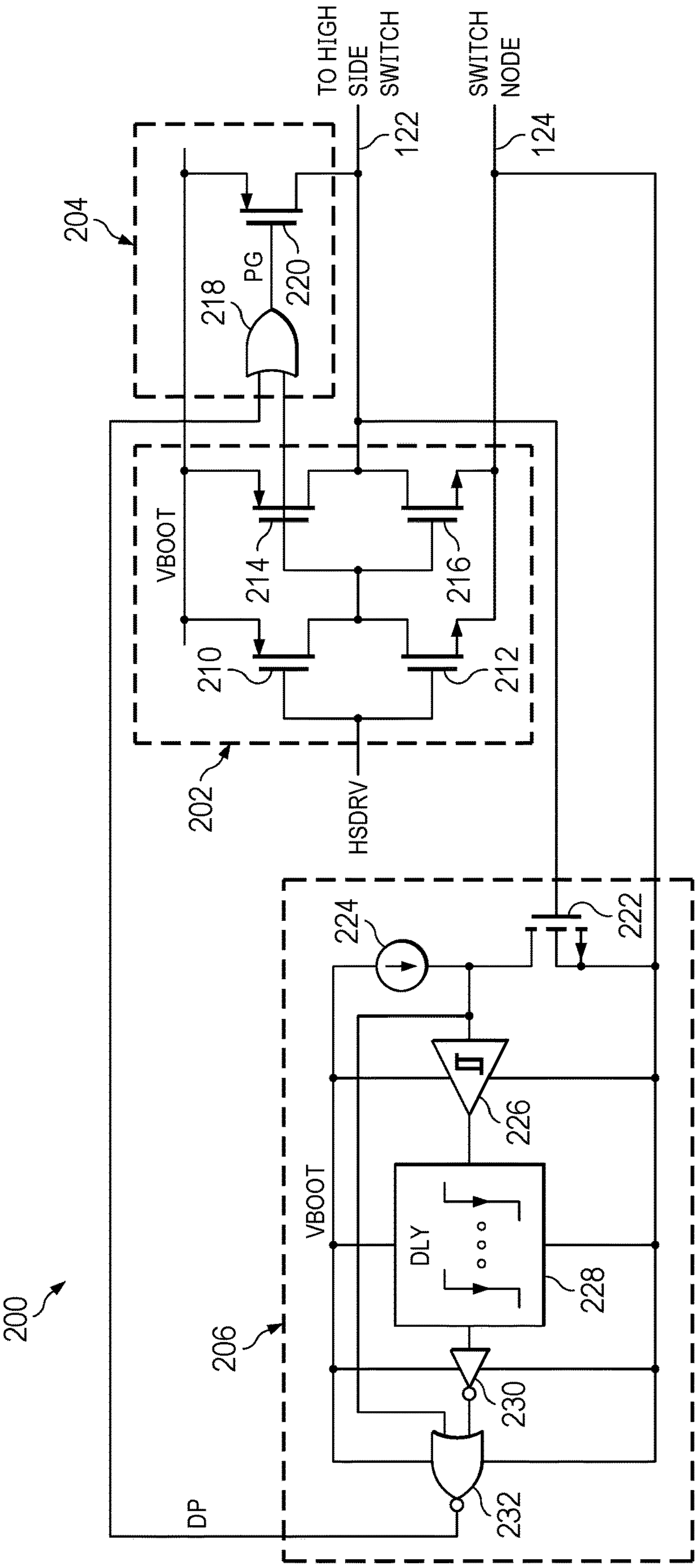
FIG. 2 is an example of a schematic diagram of high-side transistor drive circuit suitable for use in the half-bridge circuit of FIG. 1.

FIG. 2 is a schematic diagram of a high-side transistor drive circuit 200. The high-side transistor drive circuit 200 is an implementation of the high-side transistor driver circuit 114. The high-side transistor drive circuit 200 includes a drive stage 202, a drive stage 204, and a pulse circuit 206. The drive stage 202, the drive stage 204, and pulse circuit 206 are implementations of the drive stage 116, the drive stage 118, and the pulse circuit 120 respectively. The drive stage 202 includes a transistor 210, a transistor 212, a transistor 214, and a transistor 216. The transistor 210 and the transistor 214 may be p-channel field effect transistors (PFETs). The transistor 212 and the transistor 216 may be NFETs.

The transistor 210 and the transistor 212 are connected as a first inverter. A first current terminal (e.g., source) of the transistor 210 is coupled to a boot voltage terminal. The voltage provided at the boot voltage terminal may be higher than the voltage provided at the power terminal 123. A second current terminal (e.g., drain) of the transistor 210 is coupled to a first current terminal (e.g., drain) of the transistor 212. A control terminal (e.g., gate) of the transistor 210 is coupled to a control terminal (e.g., gate) of the transistor 212 and to the controller or drive terminal that provides a high-side control signal HSDRV. A second current terminal (e.g., source) of the transistor 212 is coupled to the switching node 124.

The transistor 214 and the transistor 216 are connected as a second inverter. A first current terminal (e.g., source) of the transistor 214 is coupled to the first current terminal of the transistor 210. A second current terminal (e.g., drain) of the transistor 214 is coupled to a first current terminal (e.g., drain) of the transistor 216. A control terminal (e.g., gate) of the transistor 214 is coupled to a control terminal (e.g., gate) of the transistor 216 and to the first current terminal of the transistor 212. A second current terminal (e.g., source) of the transistor 216 is coupled to the second current terminal of the transistor 212. A first output of the drive stage 202 is provided at the control input of the transistor 216, and a second output of the drive stage 202 is provided at the first current terminal of the transistor 216. The first current terminal of the transistor 216 may be coupled to the control input of the high-side transistor 102. In this implementation of the drive stage 202, when HSDRV is a logic high, the transistor 214 sources current to the control input of the high-side transistor 102.

The drive stage 204 includes a logic gate 218 and a transistor 220. The logic gate 218 may be an "OR" gate and the transistor 220 may be a PFET. The transistor 220 sources current to the drive signal 122 in parallel with the transistor 214. A first current terminal (e.g., source) of the transistor 220 is coupled to the first current terminal of the transistor 214. A second current terminal (e.g., drain of the transistor 220) is coupled to the first current terminal of the transistor 216. A control terminal (e.g., gate) of the transistor 220 is coupled to an output (gate output) of the logic gate 218. A first input (gate input) of the logic gate 218 is coupled to the control input of the transistor 214, and a second input (gate input) of the logic gate 218 is coupled to an output of the pulse circuit 206. In this implementation of the drive stage 204, when both inputs of the logic gate 218 are logic low (HSDRV is logic high, and the signal DP provided by the pulse circuit 206 is logic low), the transistor 220 is turned on to source current to the control input of the high-side transistor 102.

The pulse circuit 206 generates a pulse (e.g., pulses DP to a logic high) to momentarily disable the drive stage 204 responsive to the voltage of the drive signal 122 equaling or exceeding a threshold voltage. The pulse circuit 206 includes a transistor 222, a current source 224, a comparator circuit 226, a delay circuit 228, an inverter circuit 230, and a logic gate 232. The transistor 222 may be an NFET, and may be a replica (e.g., a scaled replica) of the high-side transistor 102. The transistor 222 may have operational parameters (e.g., a threshold voltage) that are the same as or similar to the operational parameters of the high-side transistor 102. A control terminal (e.g., gate) of the transistor 222 is coupled to the first current terminal of the transistor 216 (the control input of the high-side transistor 102). A first current terminal (e.g., source) of the transistor 222 is coupled to the switching node 124. A second current terminal (e.g., drain) of the transistor 222 is coupled to an output of the current source 224. An input of the current source 224 is coupled to the boot voltage terminal. When the voltage of the drive signal 122 rises to a level sufficient to turn on the transistor 222, the current provided by the current source 224, flows through the transistor 222, and the voltage at the output of the current source 224 drops.

The comparator circuit 226 is coupled between the second current terminal of the transistor 222 and an input (delay input) of the delay circuit 228. The comparator circuit 226 may be a Schmitt trigger circuit. The comparator circuit 226 compares the voltage at the second current terminal of the transistor 222 to a threshold voltage and changes output signal state based on the comparison. The threshold voltage may be generated within the comparator circuit 226. For example, as the transistor 222 turns on and the voltage at the input of the comparator circuit 226 drops, the signal provided at the output (comparator output) of the comparator circuit 226 falls quickly when the voltage at the input (comparator input) of the comparator circuit 226 drops below the threshold voltage.

The delay circuit 228 delays a falling edge received from the delay circuit 228. The delay time provided by the delay circuit 228 may be selected to provide sufficient time for the voltage at the switching node 124 to rise to about the voltage at the power terminal 123 while the drive stage 204 is disabled. For example, the delay circuit 228 may provide 5 nanoseconds or more of delay. The delay circuit 228 may include a number of delay elements coupled in series to produce a selected delay. In some implementations of the pulse circuit 206, the delay circuit 228 can vary the delay provided to optimize the turn-on of the high-side transistor 102. For example, the delay may be increased as load current increases, and the delay may be decreased as the load current decreases.

The inverter circuit 230 is coupled between the output (delay output) of the delay circuit 228 and a first input of the logic gate 232. A second input of the logic gate 232 is coupled to the input of the comparator circuit 226. When the voltage at the input of the comparator circuit 226 transitions from logic high to a logic low, the logic gate 232 outputs a logic high pulse having a duration that is approximately equal to the delay time of the delay circuit 228. The pulse provided by the logic gate 232 momentarily disables the drive stage 204 to slow the turn on of the high-side transistor 102, which reduces overshoot at the switching node 124.

Figure 3:
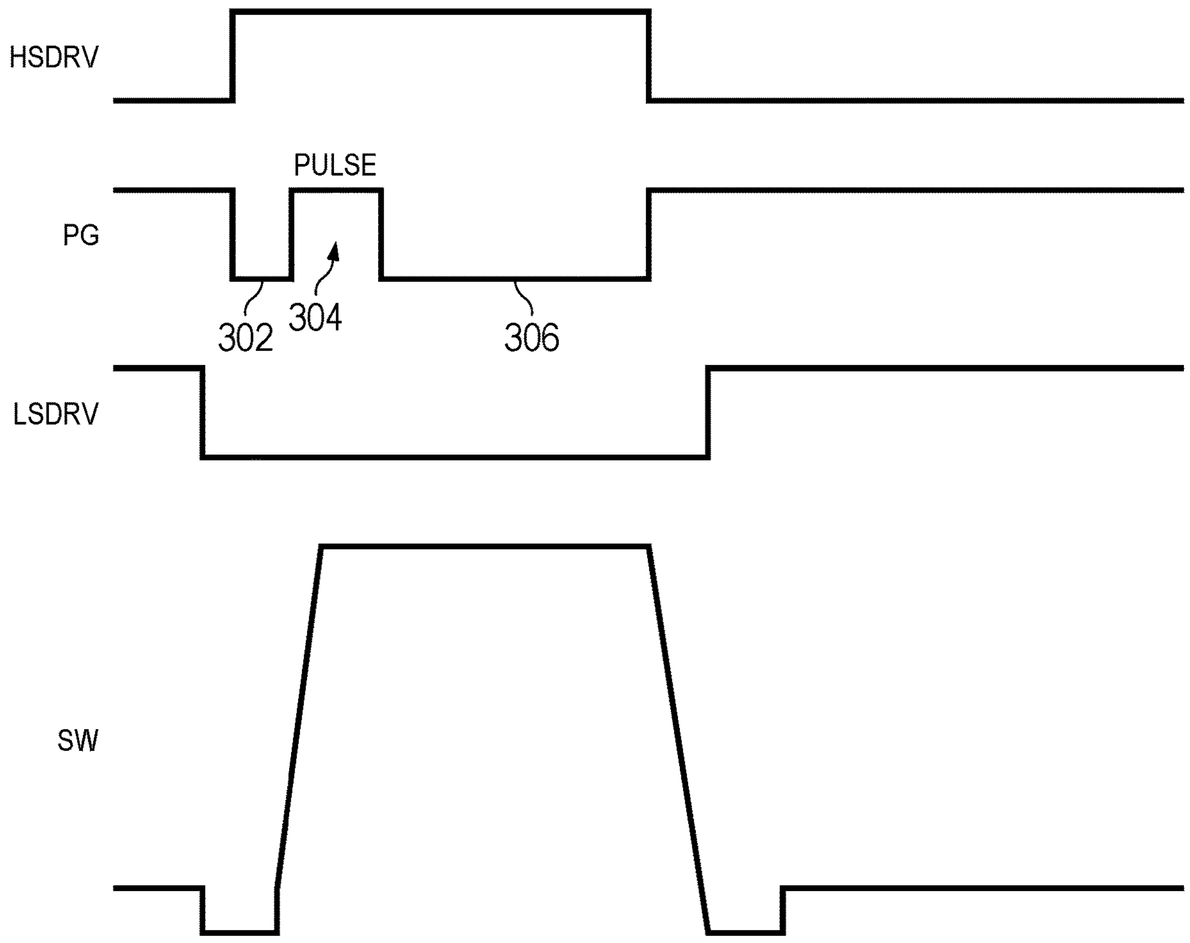
FIG. 3 is an example of a timing diagram showing a blanking pulse provided by the transistor drive circuit of FIG. 2 to momentarily disable a drive stage of the transistor drive circuit of FIG. 2.

FIG. 3 is a timing diagram showing a blanking pulse provided to momentarily disable the drive stage 204. FIG. 3 shows the high-side drive control signal (HSDRV), the low-side drive control signal (LSDRV), the switch node voltage (SW), and the pulsed gate signal (PG) provided in the drive stage 204 by the logic gate 218. LSDRV goes low to turn off the low-side transistor 104. SW falls below ground and the body diode of the low-side transistor 104 conducts. After LSDRV goes low, HSDRV goes high to turn on the high-side transistor 102. When HSDRV goes high, the drive stage 202 and the drive stage 204 are enabled to source current to the drive signal 122 and the control input of the high-side transistor 102 in the interval 302. The signal PG provided by the logic gate 218 is low in the interval 302 to turn on the transistor 220. As the high-side transistor 102 turns on, the voltage SW at the switching node 124 rises.

The transistor 222 is monitoring the voltage of the drive signal 122. When the transistor 222 turns on, the pulse circuit 206 generates a pulse and PG goes high to turn off the transistor 220. Accordingly, the current sourced to the control terminal of the high-side transistor 102 is reduced in the interval 304 to slow the turn on of the high-side transistor 102 as further discussed below with reference to FIG. 4. When the delay provided by the delay circuit 228 expires, the pulse generated by the pulse circuit 206 ends, and the drive stage 204 is turned back on in the interval 306.

Figure 4:
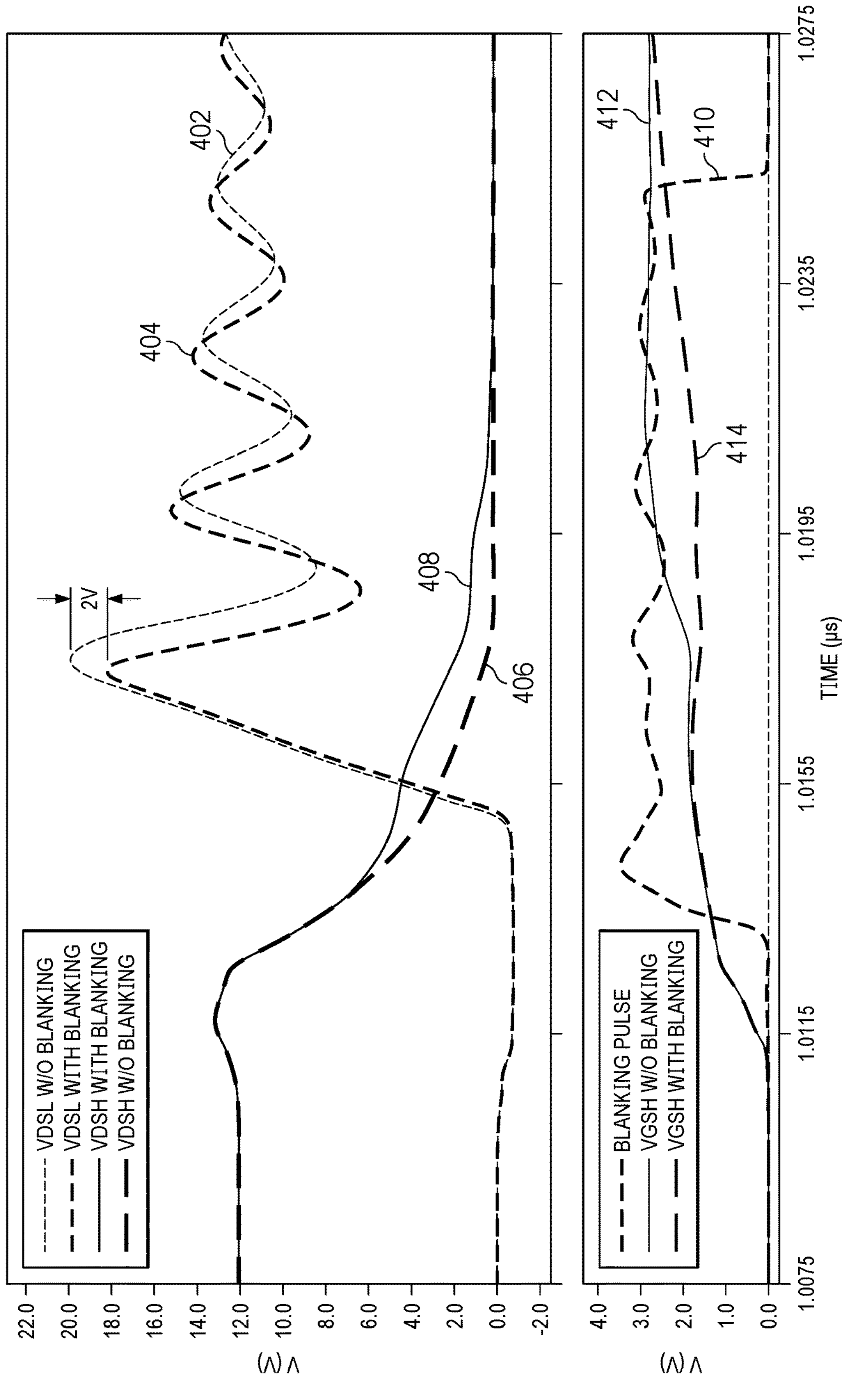
FIG. 4 is an example of a graph of switching transistor signals in the half-bridge circuit of FIG. 1 with and without the blanking pulse provided by the transistor drive circuit of FIG. 2.

FIG. 4 is a graph of switching transistor signals in the half-bridge circuit 100 with and without the blanking pulse provided by the high-side transistor drive circuit 200. FIG. 4 shows the blanking pulse (DP) 410 provided by the pulse circuit 206, the gate-to-source voltage ($V_{GSH}$) 412 of the high-side transistor 102 without the blanking pulse 410, $V_{GSH}$ 414 with the blanking pulse 410, drain-to-source voltage ($V_{DSH}$) 408 of the high-side transistor 102 without the blanking pulse 410, $V_{DSH}$ 406 with the blanking pulse 410, drain-to-source voltage ($V_{DSL}$) 402 of the low-side transistor 104 without the blanking pulse 410, and $V_{DSL}$ 404 with the blanking pulse 410.

As the high-side transistor 102 is turned on, initially both the drive stage 202 and the drive stage 204 are sourcing current. Accordingly, $V_{GSH}$ 412 is similar to $V_{GSH}$ 414, $V_{DSH}$ 406 is similar to $V_{DSH}$ 408, and $V_{DSL}$ 404 is similar to $V_{DSL}$ 402 prior to activation of the blanking pulse 410. The blanking pulse 410 disables the drive stage 204, and the current sourced to turn on the high-side transistor 102 is reduced. Without the activation of the blanking pulse 410, $V_{GSH}$ 412 increases faster than $V_{GSH}$ 414, $V_{DSH}$ 406 falls faster than the $V_{DSH}$ 408, and the peak $V_{DSL}$ 402 is greater than the peak $V_{DSL}$ 404. In FIG. 4, the peak $V_{DSL}$ 404 is 2 volts less than the peak $V_{DSL}$ 402 when the blanking is activated, which reduces the stress on the low-side transistor 104. After the blanking pulse 410, the drive stage 204 is enabled, and the current sourced to the drive signal 122 and the control input of the high-side transistor 102 increases.

Figure 5:
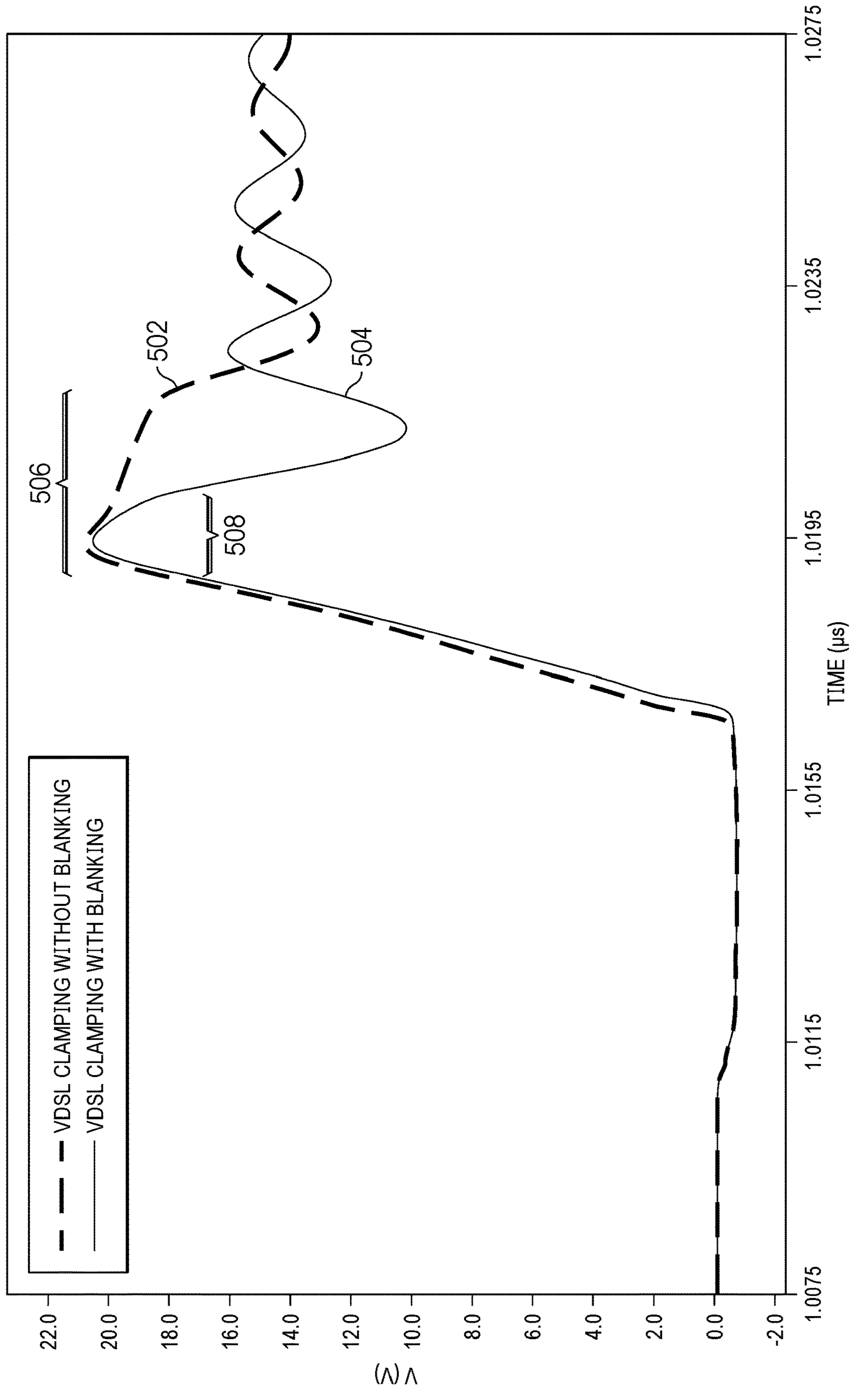
FIG. 5 is an example of a graph of clamping in the half-bridge circuit of FIG. 1 with and without the blanking pulse provided by the transistor drive circuit of FIG. 2.

FIG. 5 is a graph of clamping in the half-bridge circuit 100 with and without the high-side transistor drive circuit 200. FIG. 5 shows drain-to-source voltage ($V_{DSL}$) 502 of the low-side transistor 104 without the blanking pulse, and $V_{DSL}$ 504 with the blanking pulse. With the blanking pulse, the clamp circuit 112 clamps $V_{DSL}$ 504 in the interval 508. Without the blanking pulse, $V_{DSL}$ 502 is higher for a longer time, and the clamp circuit 112 clamps $V_{DSL}$ 502 in the interval 506. Because activation of the clamp circuit 112 reduces the efficiency of the half-bridge circuit 100, use of the blanking pulse to reduce the time during which the clamp circuit 112 is active can improve the efficiency of the half-bridge circuit 100.

Figure 6:
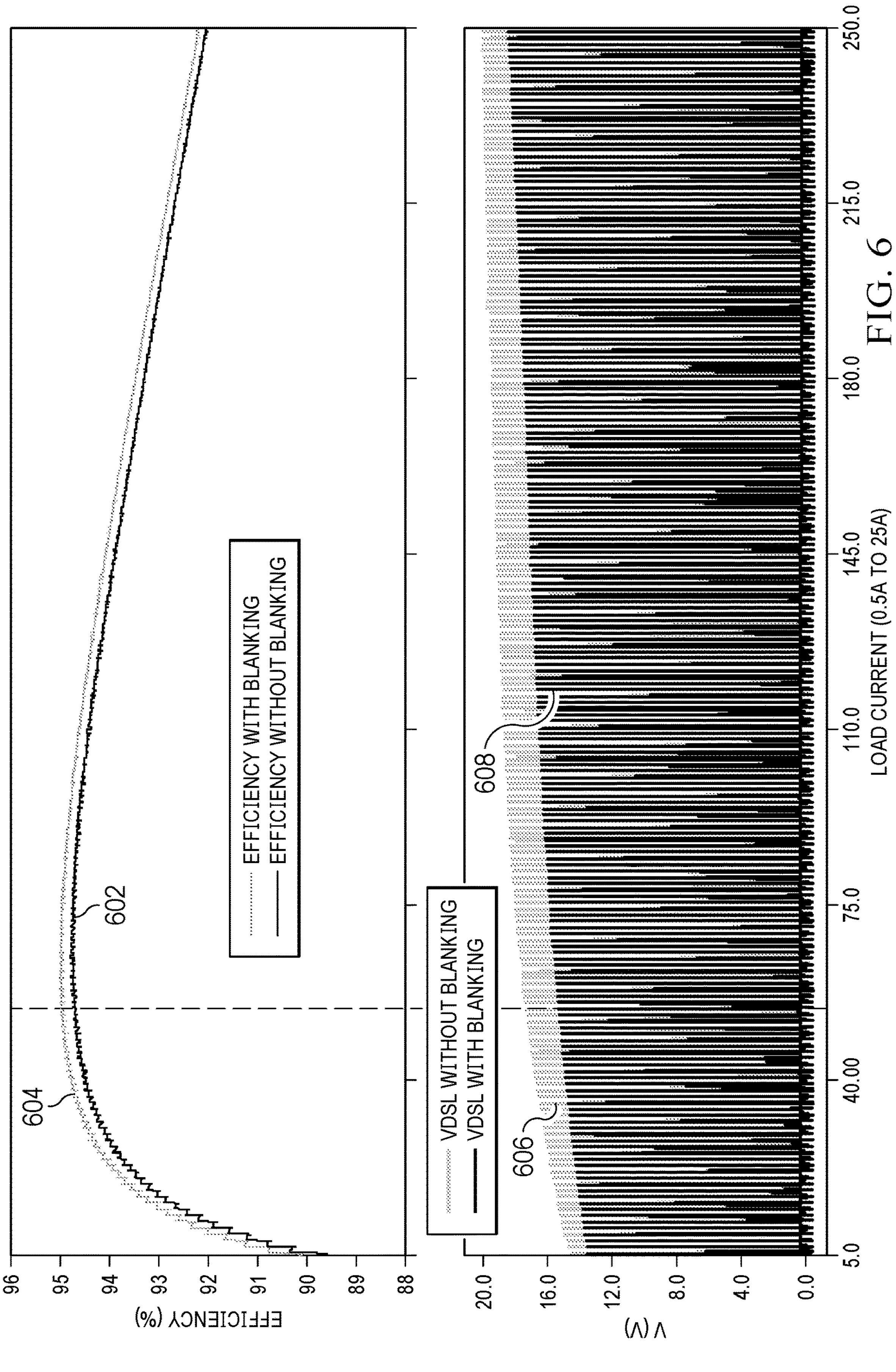
FIG. 6 is an example of a graph of efficiency of the half-bridge circuit of FIG. 1 with and without the blanking pulse provided by the transistor drive circuit of FIG. 2.

FIG. 6 is a graph of efficiency of the half-bridge circuit 100 with and without the high-side transistor drive circuit 200. FIG. 6 shows efficiency 604 with the blanking pulse provided by the high-side transistor drive circuit 200, efficiency 602 without the blanking pulse, $V_{DSL}$ 606 without the blanking pulse, and $V_{DSL}$ 608 with the blanking pulse over a range of load currents. FIG. 6 shows that over the range of load currents, $V_{DSL}$ is lower and efficiency is higher with the high-side transistor drive circuit 200, and the delayed turn-on of the high-side transistor 102 provided by the blanking pulse of the high-side transistor drive circuit 200, than without the blanking pulse. Accordingly, the high-side transistor drive circuit 200 increases the efficiency of the half-bridge circuit 100, and reduces the likelihood of damage to the low-side transistor 104 due to overvoltage.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A circuit comprising:

gate drive circuitry having an input and an output and including:

a first transistor having a first terminal coupled to a voltage supply terminal, a second terminal coupled to the output of the gate drive circuitry, and a control terminal coupled to the input of the gate drive circuitry; and a second transistor having a first terminal coupled to the output of the gate drive circuitry, a second terminal coupled to a switching terminal, and a control terminal coupled to the control terminal of the first transistor;

a third transistor having a first terminal coupled to the voltage supply terminal, a second terminal coupled to the output of the gate drive circuitry, and a control terminal;

a logic circuit having a first input, a second input coupled to the control terminal of the first transistor, and an output coupled to the control terminal of the third transistor; and a pulse generation circuit having an output coupled to the first input of the logic circuit, and including:

a fourth transistor having a first terminal coupled to the voltage supply terminal, a second terminal coupled to the switching terminal, and a control terminal coupled to the output of the gate drive circuitry.

2. The circuit of claim 1, wherein the logic circuit includes an OR gate having the first input coupled to the output of the pulse generation circuit, the second input coupled to the control terminal of the first transistor, and the output coupled to the control terminal of the third transistor.

3. The circuit of claim 1, wherein the pulse generation circuit includes a current source having a first terminal coupled to the voltage supply terminal and a second terminal coupled to the first terminal of the fourth transistor.

4. The circuit of claim 3, wherein the pulse generation circuit includes a comparator circuit having an input coupled to the second terminal of the current source and an output coupled to the output of the pulse generation circuit.

5. The circuit of claim 4, wherein the pulse generation circuit includes a delay circuit having an input coupled to the output of the comparator circuit and an output coupled to the output of the pulse generation circuit.

6. The circuit of claim 5, wherein the pulse generation circuit includes:

an inverter having an input coupled to the output of the delay circuit, and an output; and a logic gate having a first input coupled to the input of the comparator circuit, a second input coupled to the output of the inverter, and an output coupled to the first input of the logic circuit.

7. The circuit of claim 6, wherein the gate drive circuitry includes a fifth transistor having a first terminal coupled to the voltage supply terminal, a second terminal coupled to the control terminals of the first and second transistors, and a control terminal coupled to the input of the gate drive circuitry.

8. The circuit of claim 7, wherein the gate drive circuitry includes:

a sixth transistor having a first terminal coupled to the control terminals of the first and second transistors, a second terminal coupled to the switching terminal and a control terminal coupled to the input of the gate drive circuitry, wherein the control terminals of the first and second transistors are coupled to the input of the gate drive circuitry through at least one of the fifth transistor or the sixth transistor.

9. The circuit of claim 6, wherein the gate drive circuitry includes: a first inverter circuit having an input and an output and including the first transistor and the second transistor coupled between the second terminal of the first transistor and the switching terminal, the output of the first inverter circuit coupled to the output of the gate drive circuitry; and a second inverter circuit having an input coupled to the input of the gate drive circuitry and an output coupled to the input of the first inverter circuit, the second inverter circuit having fifth and sixth transistors coupled in series between the voltage supply terminal and the switching terminal.

10. A circuit comprising:

a first drive stage coupled between a voltage supply terminal and a switching terminal and having an input and a gate drive output terminal;

a second drive stage coupled between the voltage supply terminal and the gate drive output terminal, and having first and second inputs, the second input of the second drive stage coupled to the input of the first drive stage; and a pulse generation circuit having an output coupled to the first input of the second drive stage, the pulse generation circuit including:

a transistor having a first terminal coupled to the voltage supply terminal, a second terminal coupled to the switching terminal and a control terminal coupled to the gate drive output terminal; and a comparator having an input coupled to the first terminal of the transistor and an output coupled to the output of the pulse generation circuit, in which the pulse generation circuit is capable of generating a pulse to disable the second drive stage responsive to a signal at the first terminal of the transistor and a threshold voltage of the comparator.

11. The circuit of claim 10, wherein the transistor is a first transistor and the second drive stage includes:

a second transistor having a first terminal coupled to the voltage supply terminal, a second terminal coupled to the gate drive output terminal, and a control terminal; and a logic circuit having the first and second inputs of the second drive stage, and having an output coupled to the control terminal of the second transistor.

12. The circuit of claim 11, wherein the logic circuit is an OR gate.

13. The circuit of claim 11, wherein the logic circuit is a first logic circuit, and the pulse generation circuit includes:

a delay circuit having an input coupled to the output of the comparator-circuit, and having an output; and a second logic circuit having a first input coupled to the output of the delay circuit, a second input coupled to the input of the comparator, and an output coupled to the first input of the first logic circuit.

14. The circuit of claim 13, wherein the delay circuit is configured to define a width of the pulse.

15. The circuit of claim 14, wherein the second logic circuit is capable of generating the pulse based on a signal at the input of the comparator and a signal at the output of the delay circuit.

16. The circuit of claim 15, wherein the second logic circuit includes:

an inverter having an input coupled to the output of the delay circuit, and an output; and a logic gate having a first input coupled to the input of the comparator, a second input coupled to the output of the inverter, and an output coupled to the first input of the first logic circuit.

* * * * *